(12) United States Patent
Whelan

(10) Patent No.: US 9,319,000 B2
(45) Date of Patent: Apr. 19, 2016

(54) METHOD AND APPARATUS FOR IMPROVING LEAKAGE PERFORMANCE OF A MULTI-PORT AMPLIFIER

(71) Applicant: The Boeing Company, Chicago, IL (US)

(72) Inventor: Michael A. Whelan, Rancho Palos Verdes, CA (US)

(73) Assignee: THE BOEING COMPANY, Chicago, IL (US)

( * ) Notice: Subject to any disclaimer, the term of this patent is extended or adjusted under 35 U.S.C. 154(b) by 153 days.

(21) Appl. No.: 13/955,664

(22) Filed: Jul. 31, 2013

(65) Prior Publication Data

US 2015/0035594 A1 Feb. 5, 2015

(51) Int. Cl.
  *H03F 3/68* (2006.01)
  *H03F 1/08* (2006.01)
  *H03F 3/189* (2006.01)
  *H03F 3/20* (2006.01)
  *H03F 3/60* (2006.01)

(52) U.S. Cl.
  CPC .................. *H03F 1/08* (2013.01); *H03F 3/189* (2013.01); *H03F 3/20* (2013.01); *H03F 3/602* (2013.01)

(58) Field of Classification Search
  CPC ..................................................... H03F 1/3252
  USPC ........................ 330/84, 124 R, 295, 149, 304; 455/114.3
  See application file for complete search history.

(56) References Cited

U.S. PATENT DOCUMENTS

| | | | |
|---|---|---|---|
| 4,618,831 A | 10/1986 | Egami et al. | |
| 5,784,030 A | 7/1998 | Lane et al. | |
| 5,886,573 A * | 3/1999 | Kolanek | 330/10 |
| 6,437,642 B1 | 8/2002 | Rozario | |
| 7,558,541 B2 | 7/2009 | Rosen et al. | |
| 7,965,136 B2 | 6/2011 | Rhodes et al. | |
| 8,040,356 B2 | 10/2011 | Stokes | |
| 8,463,204 B2 | 6/2013 | Jones et al. | |
| 8,618,878 B2 * | 12/2013 | Hangai et al. | 330/84 |
| 2010/0271121 A1 * | 10/2010 | Jones et al. | 330/124 D |

FOREIGN PATENT DOCUMENTS

| | | |
|---|---|---|
| EP | 1152523 A1 | 11/2001 |
| EP | 2383887 A1 | 11/2011 |
| WO | WO2009080752 A1 | 7/2009 |

OTHER PUBLICATIONS

Pattan, "The Versatile Butler Matrix," Microwave Journal, Nov. 2004, 5 pages.

Tanaka et al., "Refigurable Multiport Amplifiers for In-Orbit Use," IEEE Transactions on Aerospace and Electronic Systems, vol. 42, No. 1, Jan. 2006, pp. 228-236.

(Continued)

*Primary Examiner* — Khiem Nguyen
(74) *Attorney, Agent, or Firm* — Yee & Associates, P.C.

(57) ABSTRACT

A method and apparatus for managing a multi-port amplifier. In one illustrative embodiment, an apparatus comprises the multi-port amplifier and a controller. The multi-port amplifier is configured to amplify a plurality of signals to form a plurality of amplified signals. The controller is configured to send a plurality of control adjustments to a plurality of equalizers in the multi-port amplifier to improve leakage performance of the multi-port amplifier.

20 Claims, 15 Drawing Sheets

(56) References Cited

OTHER PUBLICATIONS

James, "Optimization of a Multi-port Amplifier Using a Least Squares Evolutionary Relaxation Method," Proceedings of the 36th European Microwave Conference, Sep. 2006, pp. 886-889.

Extended European Search Report, dated Feb. 19, 2015, regarding Application No. EP14178083.3, 7 pages.

Huang et al., "Performance Improvement from Linearizing Power Amplifiers in Multi-Port Amplifier Subsystems," Proceedings of the 10th International Workshop on Signal Processing for Space Communications (SPSC), Oct. 2008, 5 pages.

* cited by examiner

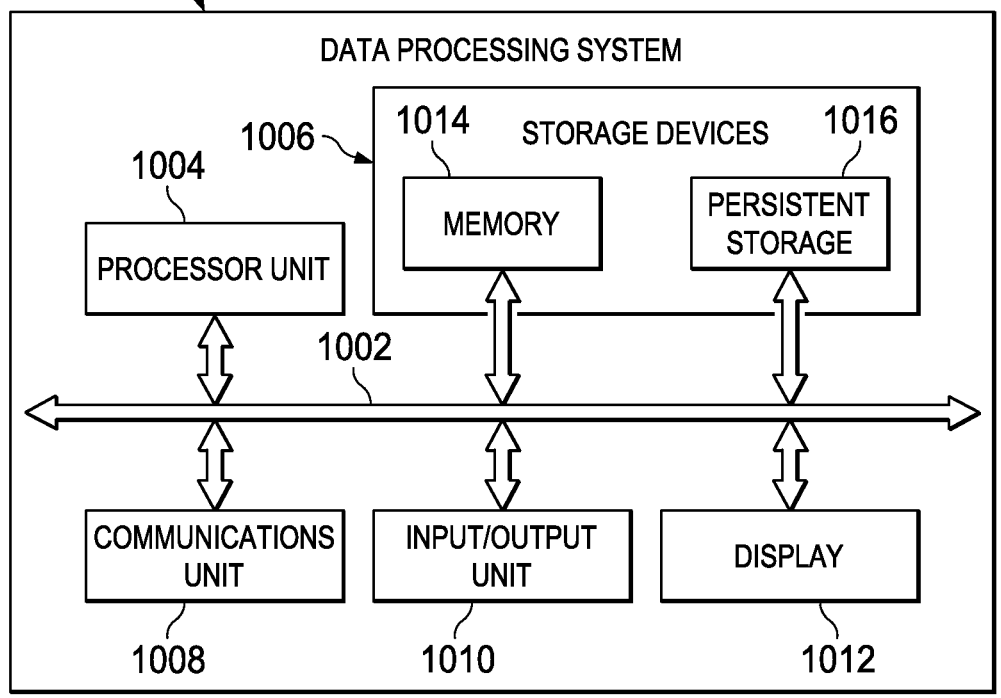
FIG. 10
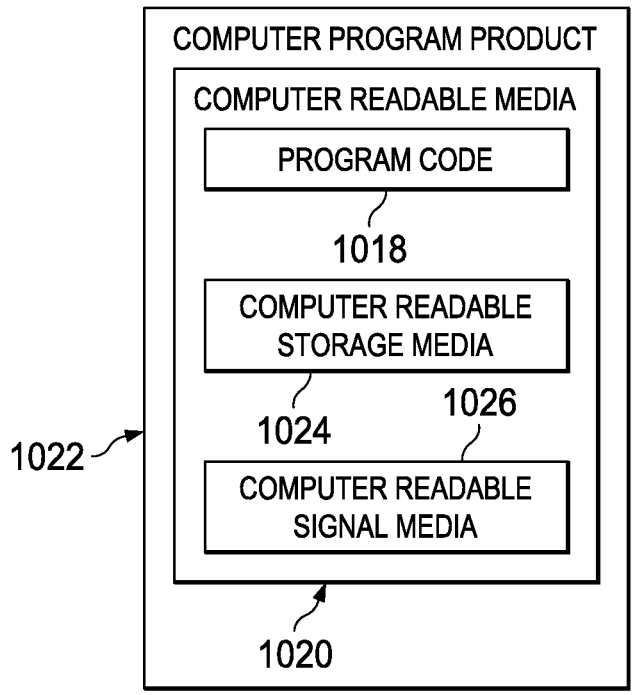

METHOD AND APPARATUS FOR IMPROVING LEAKAGE PERFORMANCE OF A MULTI-PORT AMPLIFIER

BACKGROUND INFORMATION

1. Field

The present disclosure relates generally to multi-port amplifiers. More particularly, the present disclosure relates to a method and apparatus for improving the leakage performance of a multi-port amplifier.

2. Background

Communications systems oftentimes generate signals that require amplification to high levels of power. As one illustrative example, a geostationary communications satellite that receives multiple signals in various uplink beams over multiple channels may retransmit those signals in various downlink beams amplified to high power. In some cases, these signals may be amplified by assigning one amplifier set at a fixed maximum power level to each signal that is received.

However, in some cases, it is desirable to dynamically allocate a total available pool of power among the various signals. Multi-port amplifiers (MPAs) allow this type of dynamic distribution of power.

A multi-port amplifier receives n component signals as n input signals at an input hybrid network. The input hybrid network rearranges the input signals such that the outputs of the network form an orthogonal transformation of the inputs. Each output of the input hybrid network may be referred to as a composite signal, which is the sum of a phase-shifted version of each and every input signal. For n input signals, the input hybrid network may output n composite signals.

The multi-port amplifier may also include n individual high-power amplifiers, each of which is used to amplify a corresponding composite signal. An output hybrid network is used to perform a generalized inverse transformation of the input hybrid network to separate the various composite signals back into n composite signals, each of which is amplified.

In this manner, each input signal fed into the multi-port amplifier may be amplified using any amount of the total available pool of power. The amount of power distributed to each amplified component signal output from the multi-port amplifier may be proportional to the relative power of the input signals.

For a multi-port amplifier to function properly, the input hybrid network, the output hybrid network, the high-power amplifiers, and all transmission lines connecting these components may need to be aligned in amplitude and phase within selected tolerances. Misalignment of any of the components in the multi-port amplifier may result in incomplete separation of the component signals at the output of the multi-port amplifier. In other words, the misalignment may result in leakage of the various signals across two or more of the output ports of the multi-port amplifier. This leakage may create interference with respect to the intended signals. This interference may deter the use of such multi-port amplifiers.

Some currently available multi-port amplifiers use equalizers to provide amplitude and/or phase adjustments to the composite signals prior to the composite signals being amplified by the high-power amplifiers. However, these equalizers may require special test signals and/or multiple iterations in order to reduce leakage to within selected tolerances. Further, in some cases these equalizers may be unable to reduce leakage to within selected tolerances. Therefore, it would be desirable to have a method and apparatus that take into account at least some of the issues discussed above, as well as other possible issues.

SUMMARY

In one illustrative embodiment, an apparatus comprises a multi-port amplifier and a controller. The multi-port amplifier is configured to amplify a plurality of signals to form a plurality of amplified signals. The controller is configured to send a plurality of control adjustments to a plurality of equalizers in the multi-port amplifier to improve leakage performance of the multi-port amplifier.

In another illustrative embodiment, an amplifier system may comprise an input network, a plurality of equalizers, a plurality of amplifiers, an output network, and a controller. The input network is configured to receive a plurality of signals and combine the plurality of signals to form a plurality of composite signals. The plurality of equalizers is configured to apply an adjustment to each of the plurality of composite signals to form a plurality of adjusted composite signals. The plurality of amplifiers is configured to amplify the plurality of adjusted composite signals to form a plurality of amplified composite signals. The output network is configured to deconstruct the plurality of amplified composite signals into a plurality of amplified signals. The controller is configured to send a plurality of adjustments to the plurality of equalizers to improve leakage performance of a multi-port amplifier. The controller comprises an output control network and a comparator system. The output control network is configured to receive the plurality of amplified signals. The output control network is further configured to form a plurality of first control signals using the plurality of amplified signals. The comparator system is configured to compare the plurality of first control signals to a plurality of second control signals to form a plurality of control adjustments for the plurality of equalizers that will improve the leakage performance of the multi-port amplifier.

In still yet another illustrative embodiment, a method for managing a multi-port amplifier is provided. A plurality of signals is amplified using the multi-port amplifier to form a plurality of amplified signals. A plurality of control adjustments, which is to be sent to a plurality of equalizers in the multi-port amplifier to improve leakage performance of the multi-port amplifier, is identified.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

FIG. 10 is an illustration of a data processing system in the form of a block diagram in accordance with an illustrative embodiment.

DETAILED DESCRIPTION

The illustrative embodiments recognize and take into account different considerations. For example, the illustrative embodiments recognize and take into account that it may be desirable to have the capability to improve the leakage performance of a multi-port amplifier. In particular, the illustrative embodiments recognize and take into account that it may be desirable to have the capability to improve the leakage performance of existing multi-port amplifiers without significantly altering the current configurations for these multi-port amplifiers.

Thus, the illustrative embodiments provide a method and apparatus for managing a multi-port amplifier. In one illustrative example, a plurality of signals is amplified using the multi-port amplifier to form a plurality of amplified signals. A plurality of control adjustments, which is to be sent to a plurality of equalizers in the multi-port amplifier to improve leakage performance of the multi-port amplifier, is identified using a controller.

Figure 1:
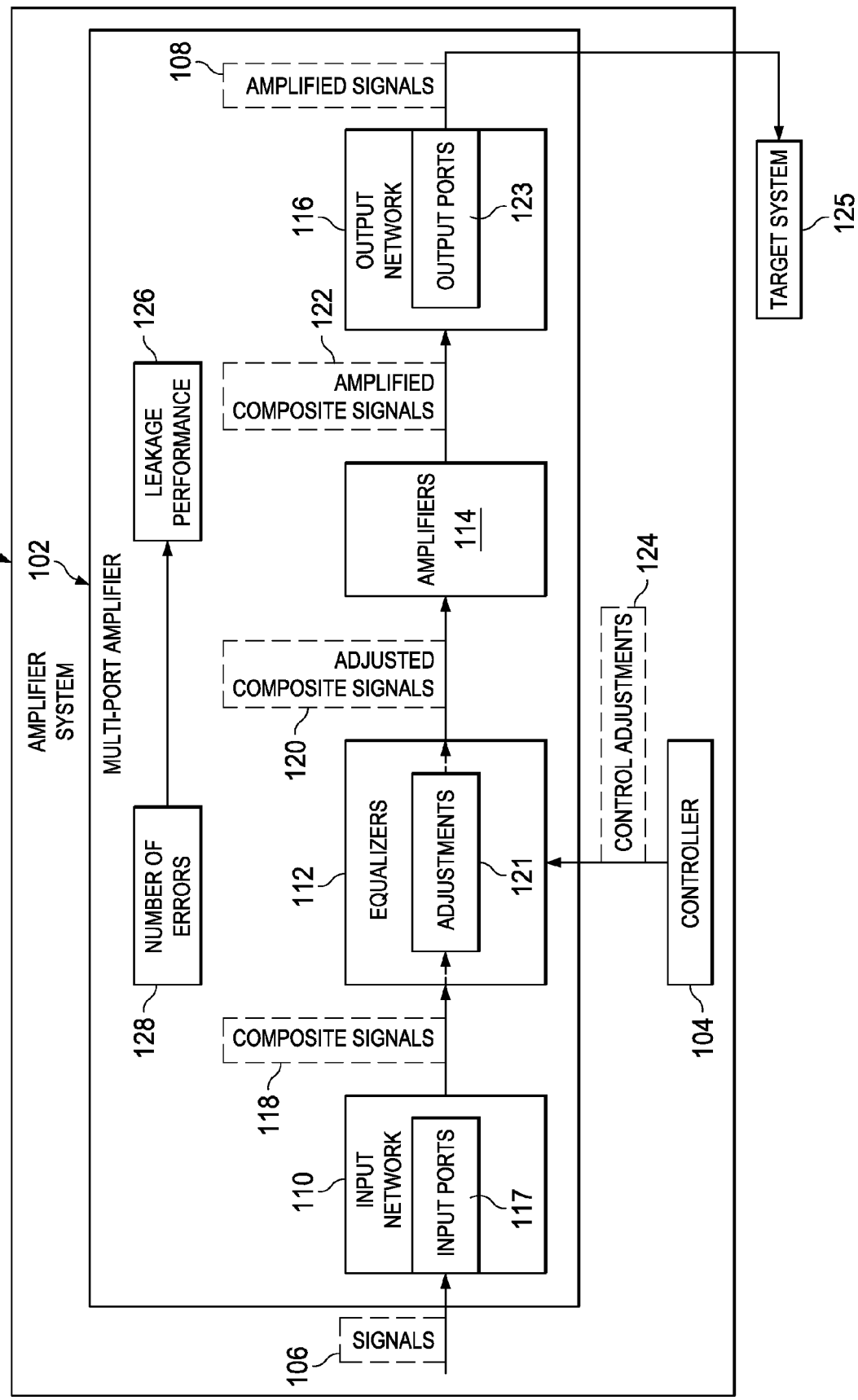
FIG. 1 is an illustration of an amplifier system in the form of a block diagram in accordance with an illustrative embodiment.

Referring now to the figures and, in particular, with reference to FIG. 1, an illustration of an amplifier system is depicted in the form of a block diagram in accordance with an illustrative embodiment. In this illustrative example, amplifier system 100 may include multi-port amplifier 102 and controller 104. Multi-port amplifier 102 may be configured to receive a plurality of signals 106 and amplify signals 106 to form a plurality of amplified signals 108.

In this illustrative example, signals 106 and amplified signals 108 may be analog signals. Signals 106 may be received at multi-port amplifier 102 from, for example, without limitation, one or more satellite systems, one or more communications systems, one or more antenna systems, and/or one or more other types of systems and devices.

As depicted, multi-port amplifier 102 may include input network 110, a plurality of equalizers 112, a plurality of amplifiers 114, and output network 116. Input network 110 may be configured to receive signals 106. In particular, input network 110 may receive signals 106 at a plurality of input ports 117.

Input network 110 may be configured to use signals 106 to form a plurality of composite signals 118. In particular, input network 110 may rearrange signals 106 such that composite signals 118 form an orthogonal transformation of signals 106. For example, without limitation, each of composite signals 118 may be a composite sum of a phase-shifted version of each and every one of signals 106. In one illustrative example, the operation performed by input network 110 may be similar to a fast Fourier transform (FFT).

Equalizers 112 may receive composite signals 118 and may make an adjustment to each of composite signals 118 to form a plurality of adjusted composite signals 120. In particular, equalizers 112 may make a plurality of adjustments 121 to composite signals 118. Each adjustment in adjustments 121 may adjust the amplitude and/or phase of a corresponding composite signal.

In this illustrative example, amplifiers 114 may receive adjusted composite signals 120. Amplifiers 114 may take the form of a plurality of high-power amplifiers (HPAs) in this example. Amplifiers 114 may amplify adjusted composite signals 120 to form a plurality of amplified composite signals 122.

Output network 116 receives amplified composite signals 122 and uses amplified composite signals 122 to form amplified signals 108. In particular, output network 116 outputs amplified signals 108 from a plurality of output ports 123.

Output network 116 may deconstruct amplified composite signals 122 back into separate component signals to form amplified signals 108. The operation performed by output network 116 may be a generalized inverse of the operation performed by input network 110. Amplified signals 108 may be sent to, for example, without limitation, target system 125. Target system 125 may comprise any number of transmission lines along which and/or target devices to which amplified signals 108 is to be sent.

In this illustrative example, controller 104 may be configured to improve leakage performance 126 of multi-port amplifier 102. Controller 104 may be implemented using hardware, software, firmware, or any combination thereof.

Controller 104 may be configured to generate a plurality of control adjustments 124 to be used by equalizers 112. Equalizers 112 may, for example, without limitation, adjust adjustments 121 made to composite signals 118 based on control adjustments 124. Each of control adjustments 124 may be, for example, an adjustment in amplitude and/or phase.

Control adjustments 124 may compensate for number of errors 128 in multi-port amplifier 102 that contribute to leakage across the signals output from output ports 123. As used herein, a "number of" items may include one or more items. In this manner, number of errors 128 may be one or more errors.

Number of errors 128 may include, for example, without limitation, any misalignment of the components within multi-port amplifier 102, including any transmission lines that may connect these components, with respect to amplitude and/or phase. Number of errors 128 may result in leakage across output ports 123. In other words, number of errors 128 may result in amplified composite signals 122 not being completely separated back out into individual component signals. By compensating for number of errors 128, controller 104 may improve leakage performance 126 of multi-port amplifier 102.

Figure 2:
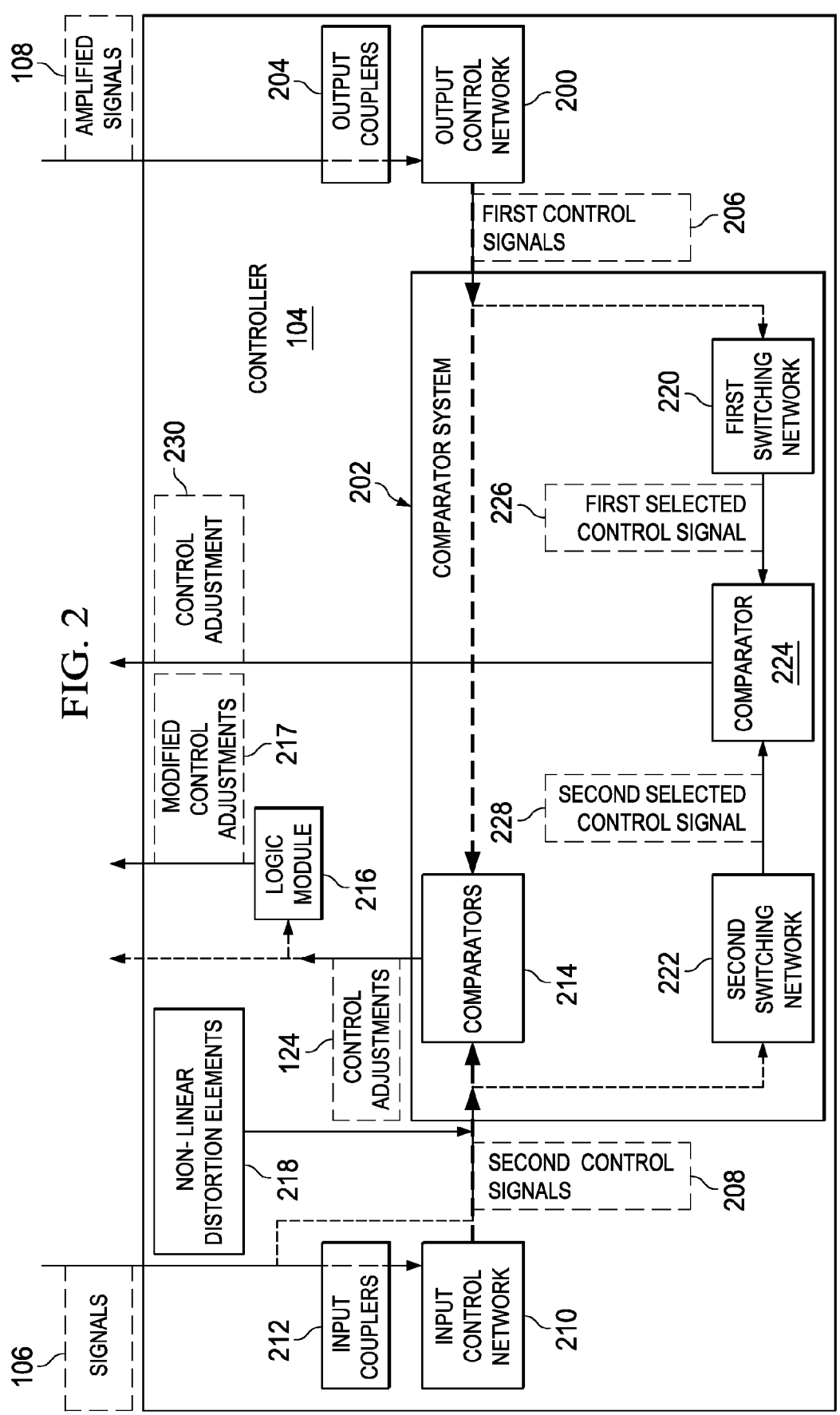
FIG. 2 is an illustration of a controller in accordance with an illustrative embodiment.

With reference now to FIG. 2, an illustration of controller 104 from FIG. 1 is depicted in accordance with an illustrative embodiment. In this illustrative example, controller 104 may include output control network 200 and comparator system 202.

Output control network 200 may receive amplified signals 108 output from output network 116 in FIG. 1. For example, without limitation, a plurality of output couplers 204 in controller 104 may be configured to couple amplified signals 108 to both target system 125 in FIG. 1 and output control network 200.

Output control network 200 may use amplified signals 108 to form plurality of first control signals 206. The operation performed by output control network 200 may be an inverse of an ideal version of the operation performed by output network 116 in FIG. 1.

Comparator system 202 may be configured to receive first control signals 206 and second control signals 208. Second control signals 208 may be received in a number of different ways.

In one illustrative example, controller 104 may include input control network 210. Input control network 210 may be configured to receive signals 106 and form second control signals 208 using signals 106. The operation performed by input control network 210 may be an ideal version of the operation performed by input network 110 in FIG. 1.

In the above described example, a plurality of input couplers 212 may be used to couple signals 106 to both input network 110 in FIG. 1 and input control network 210. However, in another illustrative example, input couplers 212 may be configured to couple signals 106 to input network 110 in FIG. 1 and comparator system 202 directly. In this manner, comparator system 202 may receive signals 106 as second control signals 208.

Comparator system 202 may be configured to compare first control signals 206 and second control signals 208 to form control adjustments 124. In particular, for each corresponding pair of signals from first control signals 206 and second control signals 208, comparator system 202 may determine the control adjustment needed to minimize the difference between the pair of signals.

In one illustrative example, comparator system 202 may be comprised of a plurality of comparators 214. Comparators 214 may receive first control signals 206 and second control signals 208. A comparator in comparators 214 may compare the control signal in first control signals 206 received at the comparator and the control signal in second control signals 208 received at the comparator. The comparator may then identify the amplitude and/or phase adjustment needed in order to minimize the difference between these two control signals. The amplitude and/or phase adjustment identified may be used to form a control adjustment that is then sent to a corresponding equalizer in equalizers 112 in FIG. 1.

For example, a signal input into multi-port amplifier 102 in FIG. 1 may enter as u and exit as y. Mathematically, the ideal multi-port amplifier may be represented by the complex matrix equation:

$$y = \beta E \alpha u \qquad (1)$$

where E is a diagonal matrix representing equalizers 112 in FIG. 1, $\alpha$ represents the ideal operation performed by input network 110 in FIG. 1, and $\beta$ represents the ideal operation performed by output network 116 in FIG. 1.

Equation (1) may be rewritten as follows:

$$E(\alpha u) = \beta^{-1} y \qquad (2)$$

where E represents the equalizer adjustments that make $\beta^{-1} y = \alpha u$.

However, number of errors 128 in FIG. 1 may result in the ideal operations not being performed. The actual operation performed by input network 110 may be represented by, for example, A, and the actual operation performed by output network 116 may be represented by, for example, B.

Input control network 210 may be configured such that the operation performed by input control network 210 is substantially equivalent to $\alpha$. Output control network 200 may be configured such that the operation performed by output control network 200 is substantially equivalent to $\beta^{-1}$. By passing amplified signals 108 through $\beta^{-1}$, the net effect of number of errors 128 in multi-port amplifier 102 may be arranged such that these errors may be compared against the ideal $\alpha u$. For a particular u and y, each of comparators 214 may be configured to identify the adjustment needed in order for $\beta^{-1} y$ to be equal to $\alpha u$.

In some illustrative examples, controller 104 may include logic module 216. Control adjustments 124 may be sent into logic module 216 prior to being sent to equalizers 112 in this example. Logic module 216 may be configured to modify control adjustments 124 to form a plurality of modified control adjustments 217, which may then be sent to equalizers 112 in FIG. 2.

Logic module 216 may be used in a number of different ways. Logic module 216 may be used to decrease the tuning of all of equalizers 112 to avoid equalizers 112 being driven beyond their capable ranges. In some cases, logic module 216 may be used to change the routing of a signal when an equalizer and/or amplifier need to be switched out of multi-port amplifier 102. In this manner, logic module 216 may be used to tune equalizers 112 in a number of different ways to achieve a desired result.

In other illustrative examples, controller 104 may include a plurality of non-linear distortion elements 218. Non-linear distortion elements 218 may be used to apply distortion to second control signals 208 prior to second control signals 208 being sent to comparator system 202.

For example, in some cases, the outputs of amplifiers 114 may be distorted versions of the inputs to amplifiers 114 in FIG. 1. Comparator system 202 may be unable to distinguish between misalignment errors within multi-port amplifier 102 and distortion errors caused by amplifiers 114. To improve the compensation for number of errors 128, non-linear distortion elements 218 may be used to produce distortion similar to the distortion that may be produced by amplifiers 114. In this manner, comparator system 202 may be able to cancel out the effects of this distortion. An example of one implementation for a non-linear distortion element in non-linear distortion elements 218 may be an envelope limiter that clips a signal in a manner that mimics the saturation of a high-power amplifier.

Although comparator system 202 has been described as having comparators 214, comparator system 202 may comprise first switching network 220, second switching network 222, and comparator 224 in another illustrative example. First switching network 220 and second switching network 222 may switch together.

First switching network 220 may be configured to receive first control signals 206 and send first control signals 206 to comparator 224 one at a time. Similarly, second switching network 222 may be configured to receive second control signals 208 and send second control signals 208 to comparator 224 one at a time.

For example, first switching network 220 may send selected first control signal 226 to comparator 224 at the same time that second switching network 222 sends selected second control signal 228 to comparator 224. Comparator 224 may compare these two selected control signals to identify control adjustment 230. Control adjustment 230 may then be sent to a corresponding equalizer in equalizers 112 in FIG. 1.

The illustrations of amplifier system 100 in FIG. 1 and controller 104 in FIG. 2 are not meant to imply physical or architectural limitations to the manner in which an illustrative embodiment may be implemented. Other components in addition to or in place of the ones illustrated may be used. Some components may be optional. Also, the blocks are presented to illustrate some functional components. One or more of these blocks may be combined, divided, or combined and divided into different blocks when implemented in an illustrative embodiment.

Figure 3A:
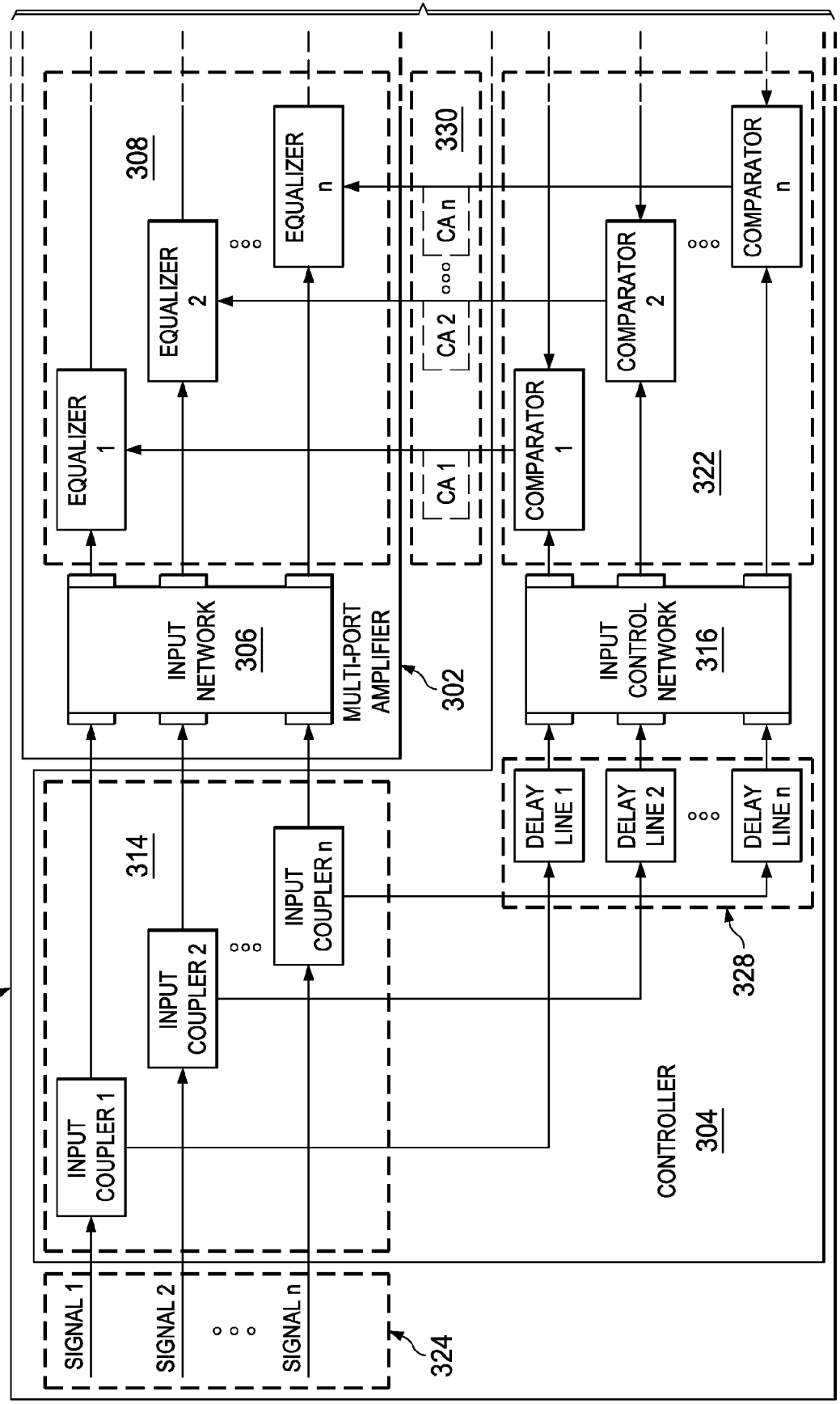
FIGS. 3A and 3B are an illustration of an amplifier system in accordance with an illustrative embodiment.
Figure 3B:
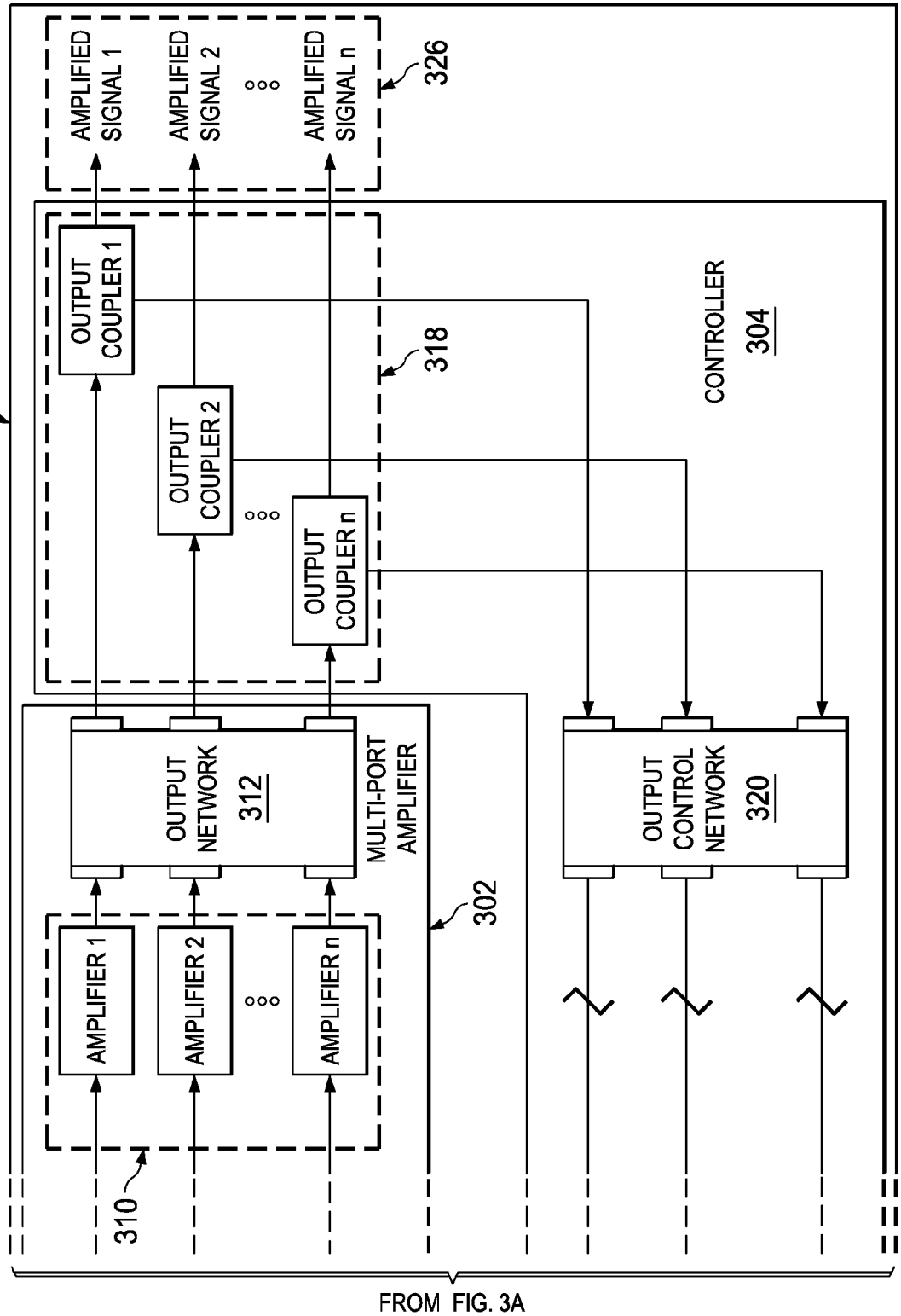

With reference now to FIGS. 3A and 3B, an illustration of an amplifier system is depicted in accordance with an illustrative embodiment. In this illustrative example, amplifier system 300 may be an example of one implementation for amplifier system 100 in FIG. 1. As depicted, amplifier system 300 may include multi-port amplifier 302 and controller 304, which may be examples of implementations for multi-port amplifier 102 and controller 104, respectively, in FIG. 1.

In this illustrative example, multi-port amplifier 302 may include input network 306, equalizers 308, amplifiers 310, and output network 312. Input network 306, equalizers 308, amplifiers 310, and output network 312 may be examples of implementations for input network 110, equalizers 112, amplifiers 114, and output network 116, respectively, in FIG. 1.

Further, controller 304 may include input couplers 314, input control network 316, output couplers 318, output control network 320, and comparators 322. Input couplers 314, input control network 316, output couplers 318, output control network 320, and comparators 322 may be examples of implementations for input couplers 212, input control network 210, output couplers 204, output control network 200, and comparators 214, respectively, in FIG. 2.

Input couplers 314 may be configured to couple signals 324 to both input network 306 and input control network 316. Input network 306 may process signals 324 to form composite signals. These composite signals may then be adjusted by equalizers 308 to form adjusted composite signals. These adjusted composite signals may be amplified by amplifiers 310 to form amplified composite signals. The amplified composite signals may then be processed by output network 312 to form amplified signals 326.

Output couplers 318 may couple amplified signals 326 to output control network 320. Output control network 320 may form first control signals using amplified signals 326 that may then be sent to comparators 322.

Signals 324 sent to input control network 316 from input couplers 314 may be sent through delay lines 328 in this illustrative example. Input control network 316 may form second control signals using signals 324 and send these control signals to comparators 322. Delay lines 328 may be fixed delay lines used to compensate for the time path difference between the first control signals arriving at comparators 322 from output control network 320 and the second control signals arriving at comparators 322 from input control network 316.

Comparators 322 may compare the different control signals to form control adjustments 330 that are then sent to equalizers 308. Equalizers 308 may use these control adjustments to compensate for errors within multi-port amplifier 302 to improve the leakage performance of multi-port amplifier 302.

Figure 4A:
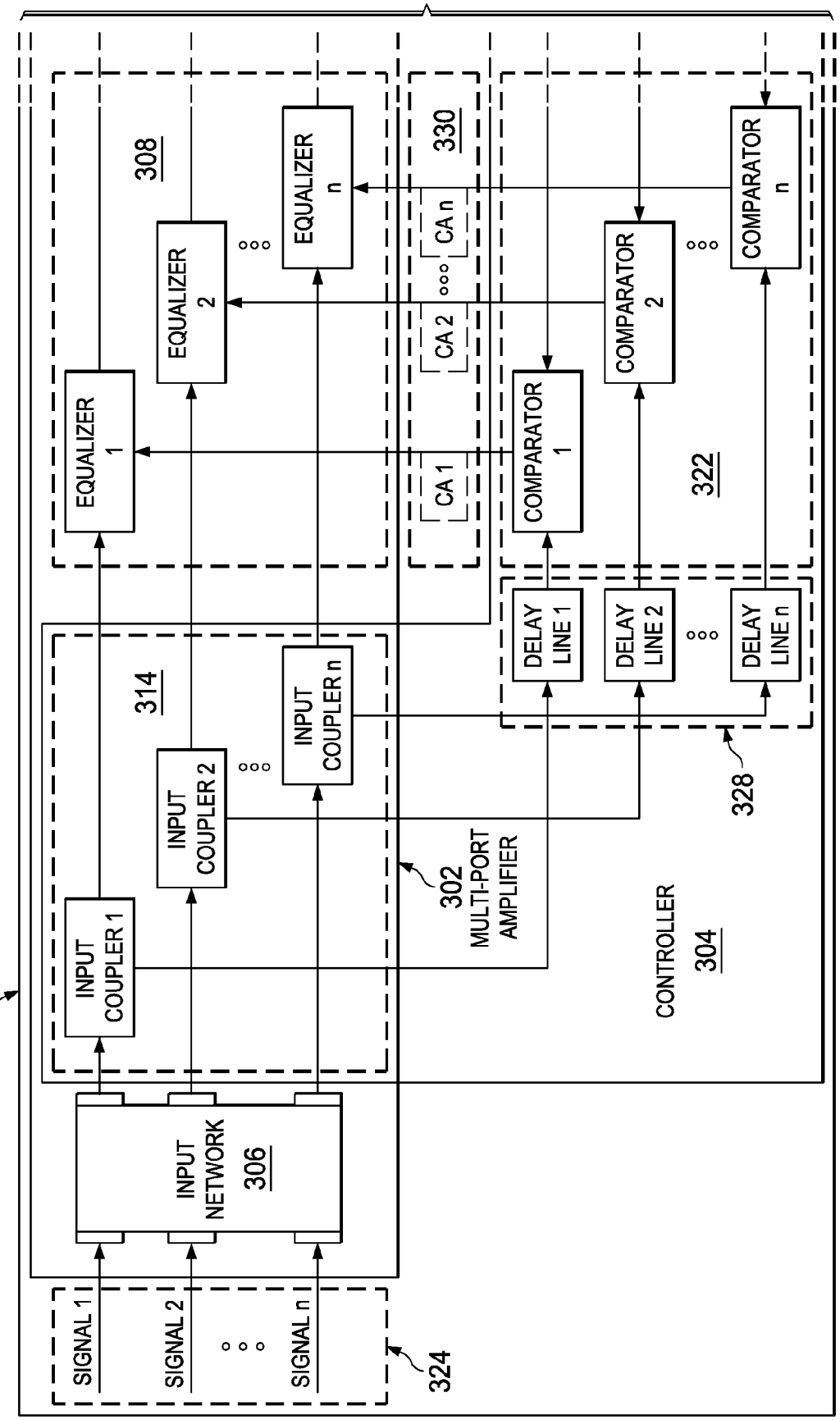
FIGS. 4A and 4B are an illustration of another configuration for an amplifier system in accordance with an illustrative embodiment.
Figure 4B:
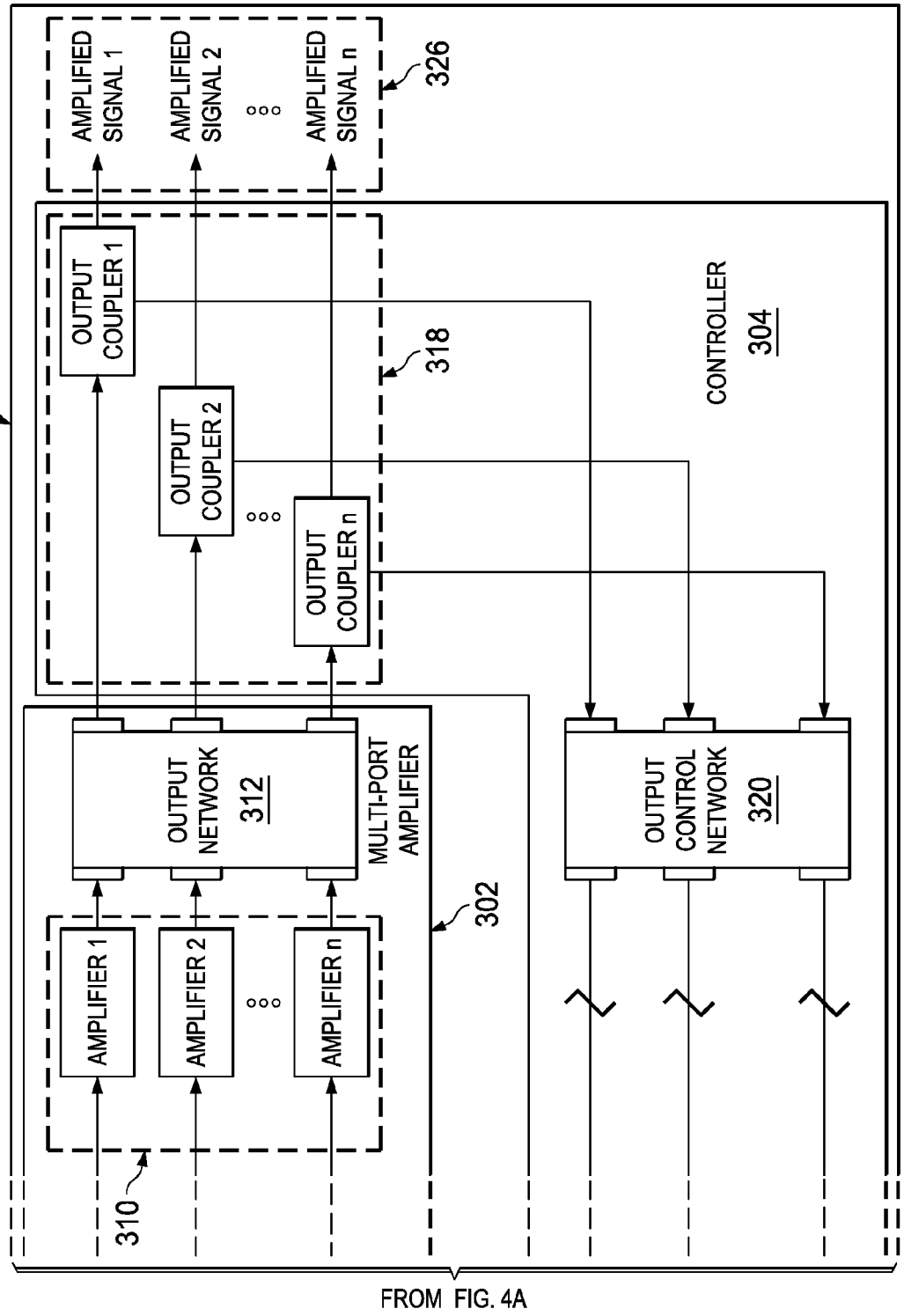

With reference now to FIGS. 4A and 4B, an illustration of another configuration for amplifier system 300 from FIGS. 3A and 3B is depicted in accordance with an illustrative embodiment. In this illustrative example, input couplers 314 may now be configured to couple the composite signals formed by input network 306 to equalizers 308 and comparators 322. Input control network 316 from FIG. 3A may not be included in this configuration for controller 304.

In some cases, input network 306 may not be subject to the extreme power fluctuations and thermal fluctuations that induce errors. Consequently, input control network 316 may not be needed. The operation performed by input network 306 may be sufficiently close to the desired ideal operation. In this illustrative example, the composite signals formed by input network 306 are sent through delay lines 328 from input couplers 314 to comparators 322.

Figure 5A:
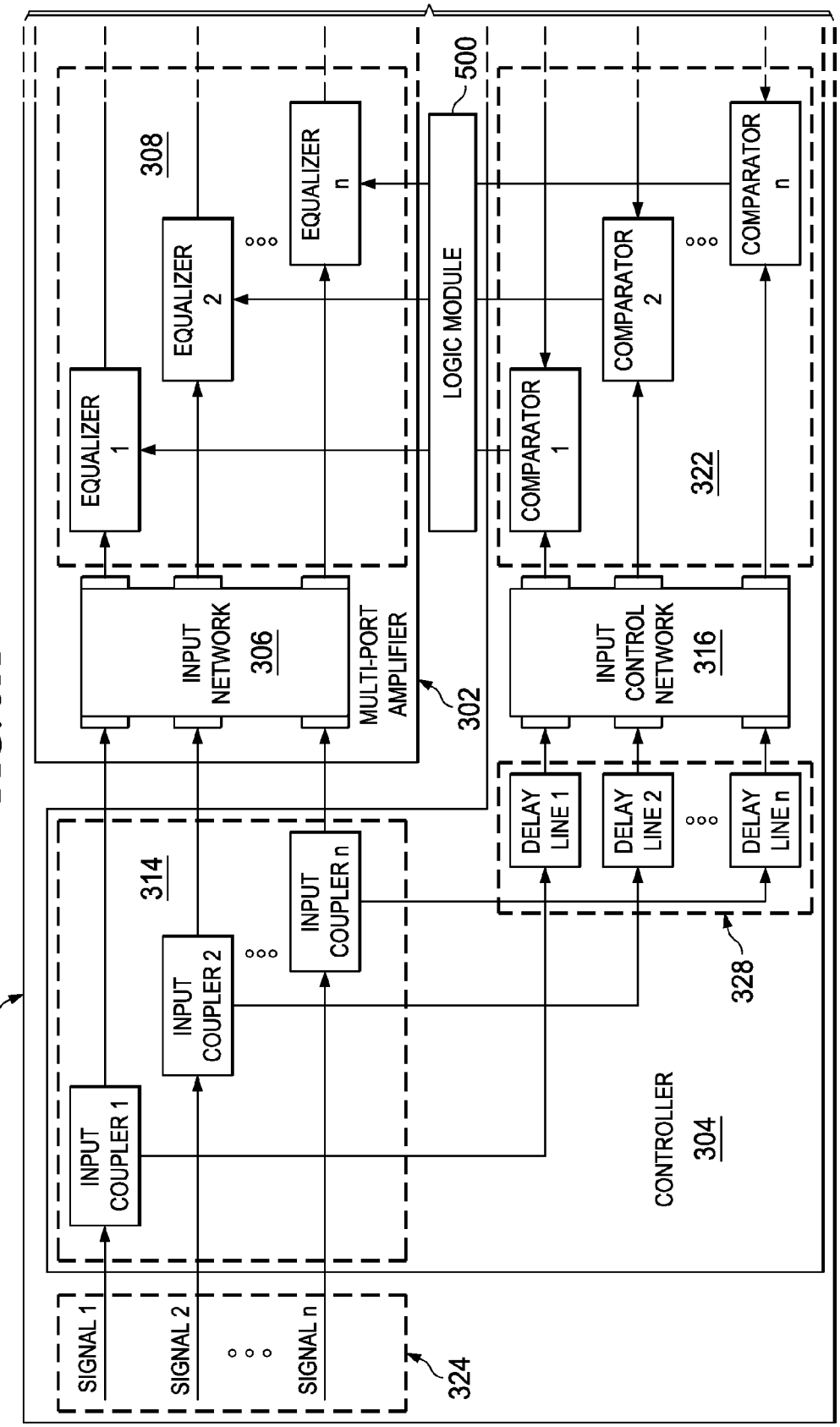
FIGS. 5A and 5B are an illustration of yet another configuration for an amplifier system in accordance with an illustrative embodiment.
Figure 5B:
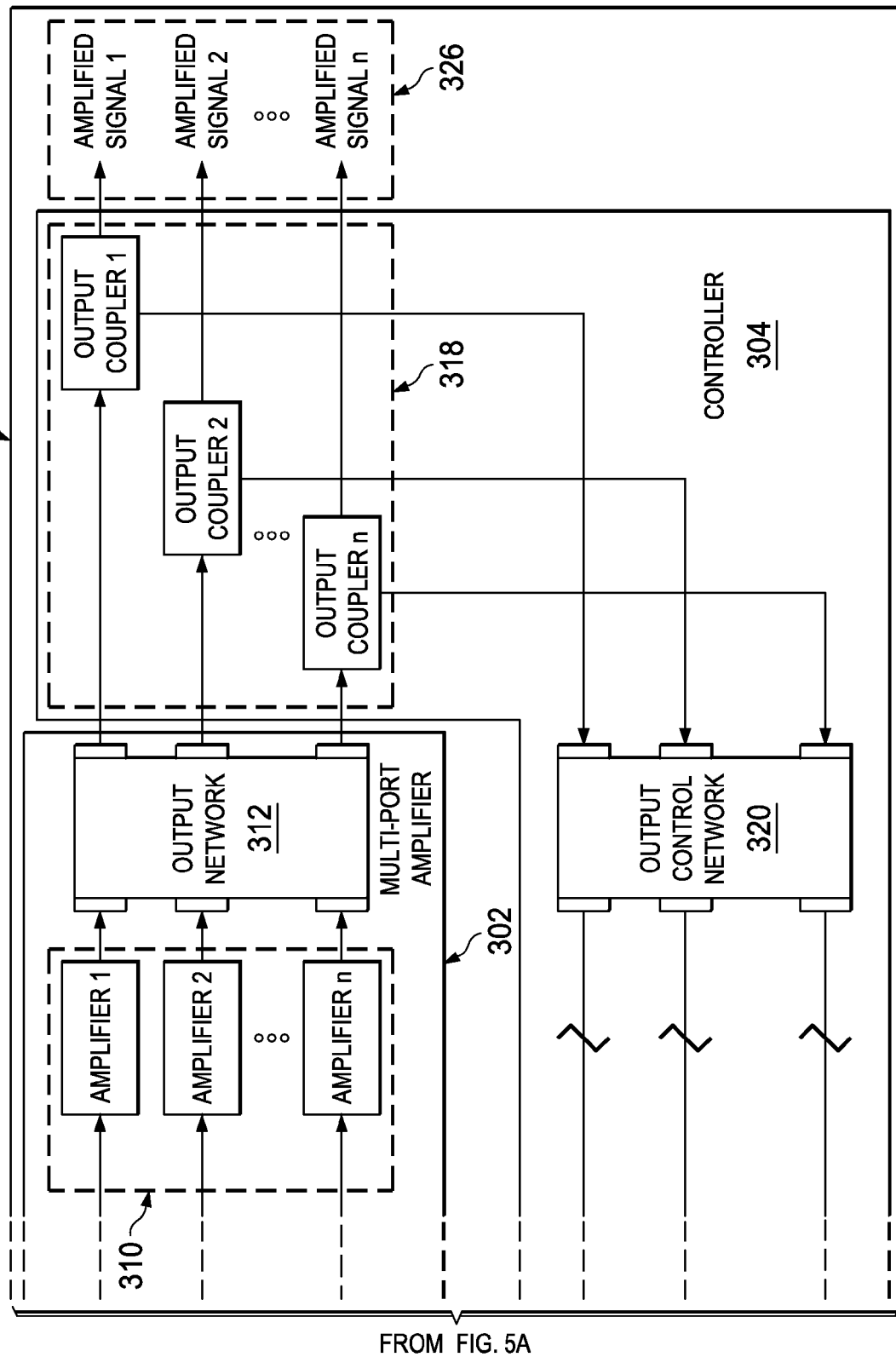

With reference now to FIGS. 5A and 5B, an illustration of yet another configuration for amplifier system 300 from FIGS. 3A and 3B is depicted in accordance with an illustrative embodiment. In this illustrative example, logic module 500 has been added to amplifier system 300 from FIGS. 3A and 3B. Logic module 500 may be an example of one implementation for logic module 216 in FIG. 2. Logic module 500 may modify the control adjustments made by comparators 322 prior to these adjustments being sent to equalizers 308.

Figure 6A:
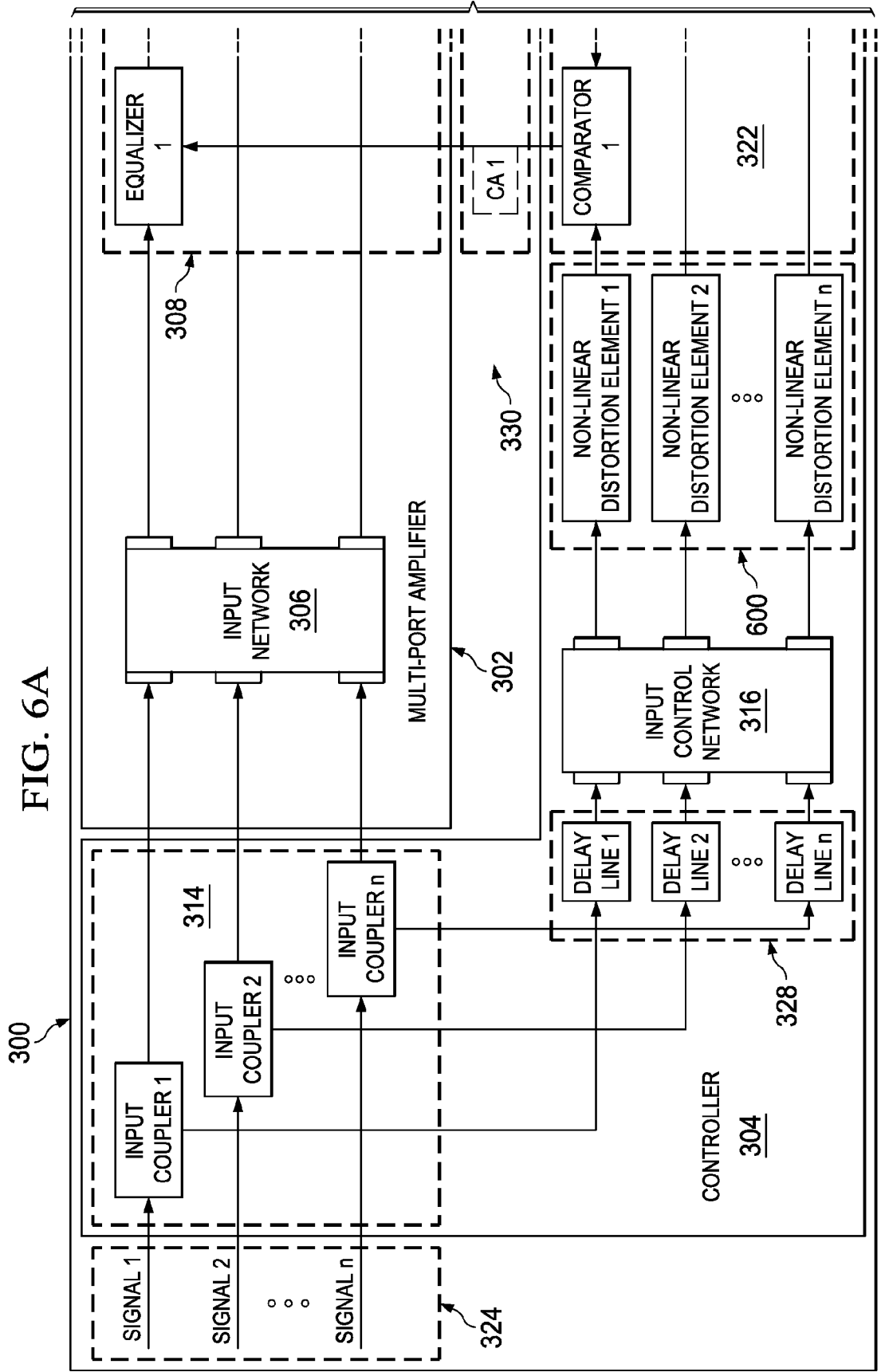
FIGS. 6A and 6B are an illustration of still another configuration for an amplifier system in accordance with an illustrative embodiment.
Figure 6B:
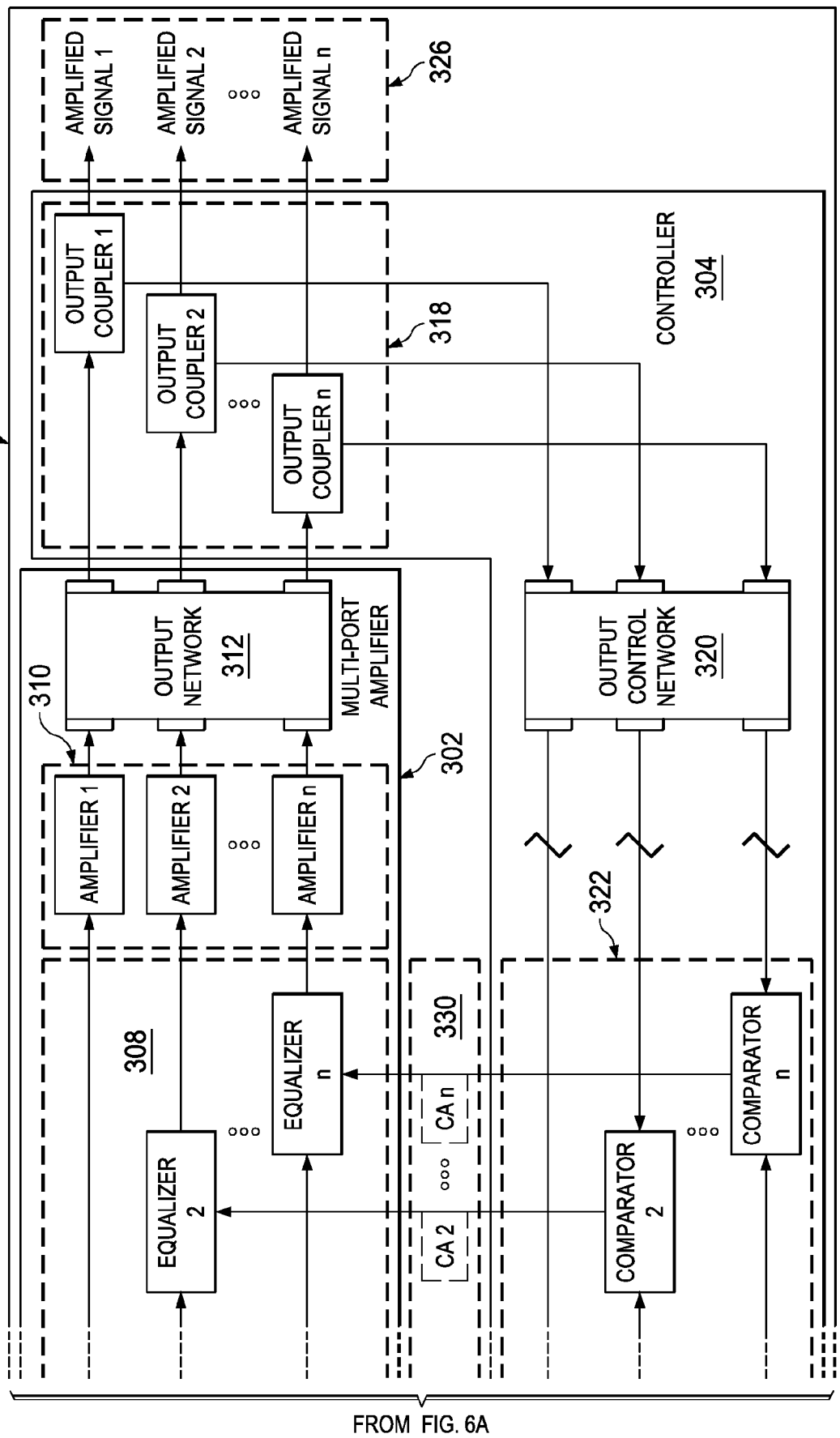

With reference now to FIGS. 6A and 6B, an illustration of still another configuration for amplifier system 300 from FIGS. 3A and 3B is depicted in accordance with an illustrative embodiment. In this illustrative example, non-linear distortion elements 600 has been added to amplifier system 300 from FIGS. 3A and 3B. Non-linear distortion elements 600 may be an example of one implementation for non-linear distortion elements 218 in FIG. 2.

Non-linear distortion elements 600 may apply distortion to the control signals formed by input control network 316. This distortion may mimic the distortion created by amplifiers 310 in FIG. 3B.

Figure 7A:
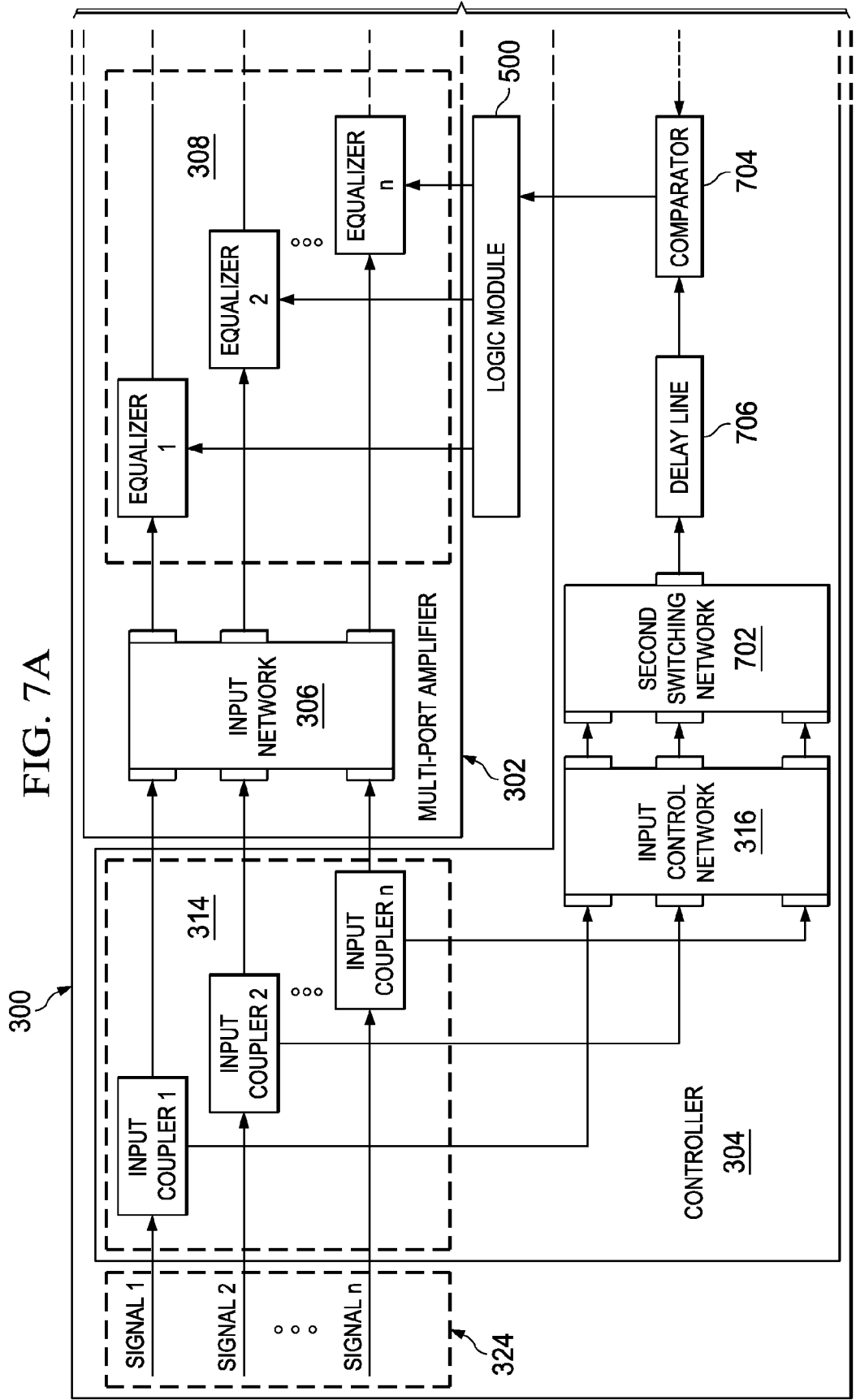
FIGS. 7A and 7B are an illustration of another configuration for an amplifier system in accordance with an illustrative embodiment.
Figure 7B:
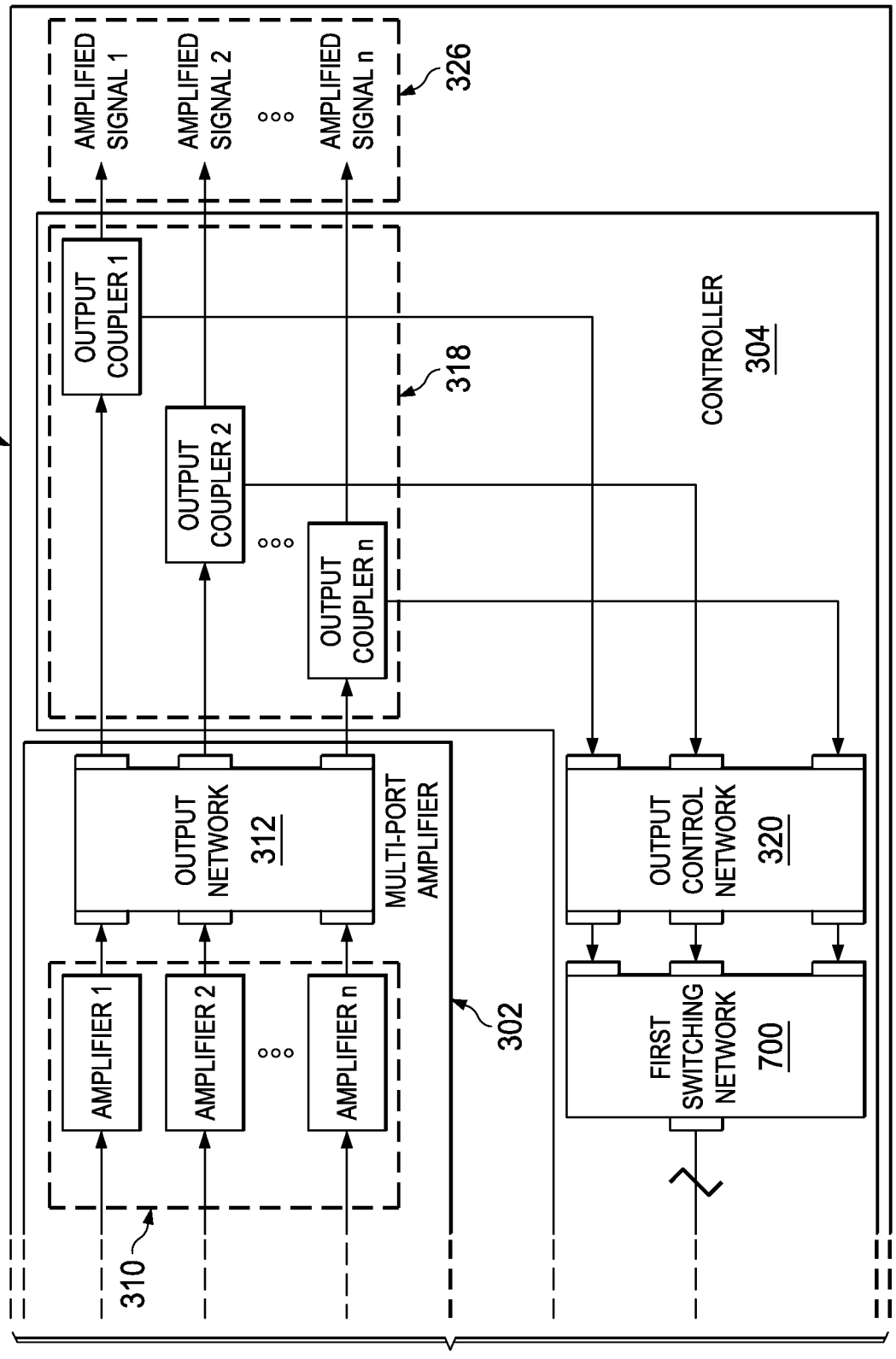

With reference now to FIGS. 7A and 7B, an illustration of another configuration for amplifier system 300 from FIGS. 3A and 3B is depicted in accordance with an illustrative embodiment. In this illustrative example, comparators 322 from FIG. 3A have been replaced by first switching network 700, second switching network 702, and comparator 704. Further, delay lines 328 from FIG. 3A are not included. Instead, delay line 706 has been added between second switching network 702 and comparator 704.

In this illustrative example, first switching network 700, second switching network 702, and comparator 704 may be examples of implementations for first switching network 220, second switching network 222, and comparator 224, respectively, in FIG. 2. First switching network 700 and second switching network 702 may switch at the same time and may be configured to send a control signal formed by input control network 316 to comparator 704 at the same time as a corresponding control signal formed by output control network 320. Delay line 706 may be used to account for any time differences such that both control signals arrive at comparator 704 at the same time.

Comparator 704 may then compare the two control signals and form a control adjustment that is then sent to a corresponding equalizer in equalizers 308. In this illustrative example, logic module 500 from FIG. 5A is also included in controller 304. However, in other illustrative examples, logic module 500 may be replaced by a switching network.

Figure 8:
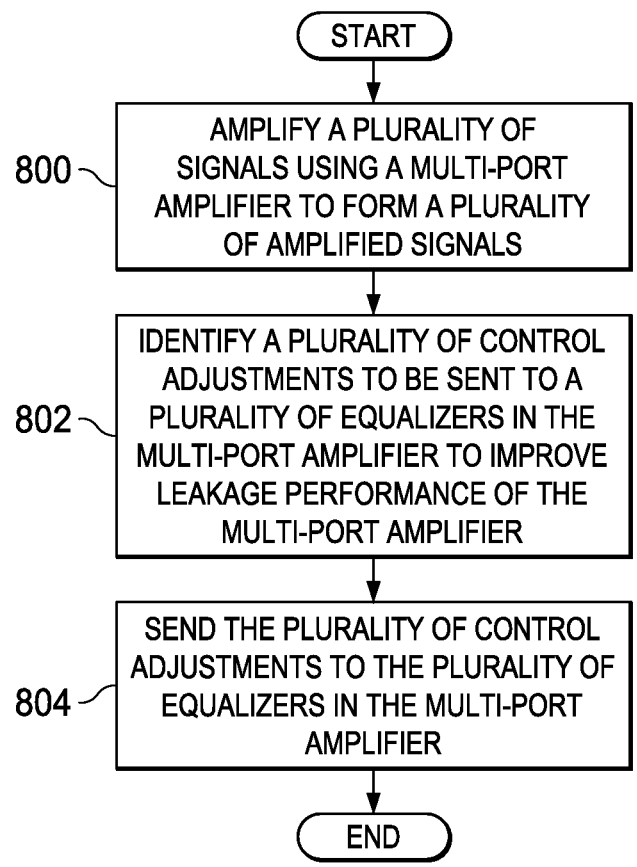
FIG. 8 is an illustration of a process for managing a multi-port amplifier in the form of a flowchart in accordance with an illustrative embodiment.

With reference now to FIG. 8, an illustration of a process for managing a multi-port amplifier is depicted in the form of a flowchart in accordance with an illustrative embodiment. The process illustrated in FIG. 8 may be implemented to manage multi-port amplifier 102 in FIG. 1.

The process may begin by amplifying a plurality of signals using a multi-port amplifier to form a plurality of amplified signals (operation 800). A plurality of control adjustments to be sent to a plurality of equalizers in the multi-port amplifier to improve leakage performance of the multi-port amplifier may be identified (operation 802). The plurality of control adjustments may be sent to the plurality of equalizers in the multi-port amplifier (operation 804), with the process terminating thereafter.

Figure 9:
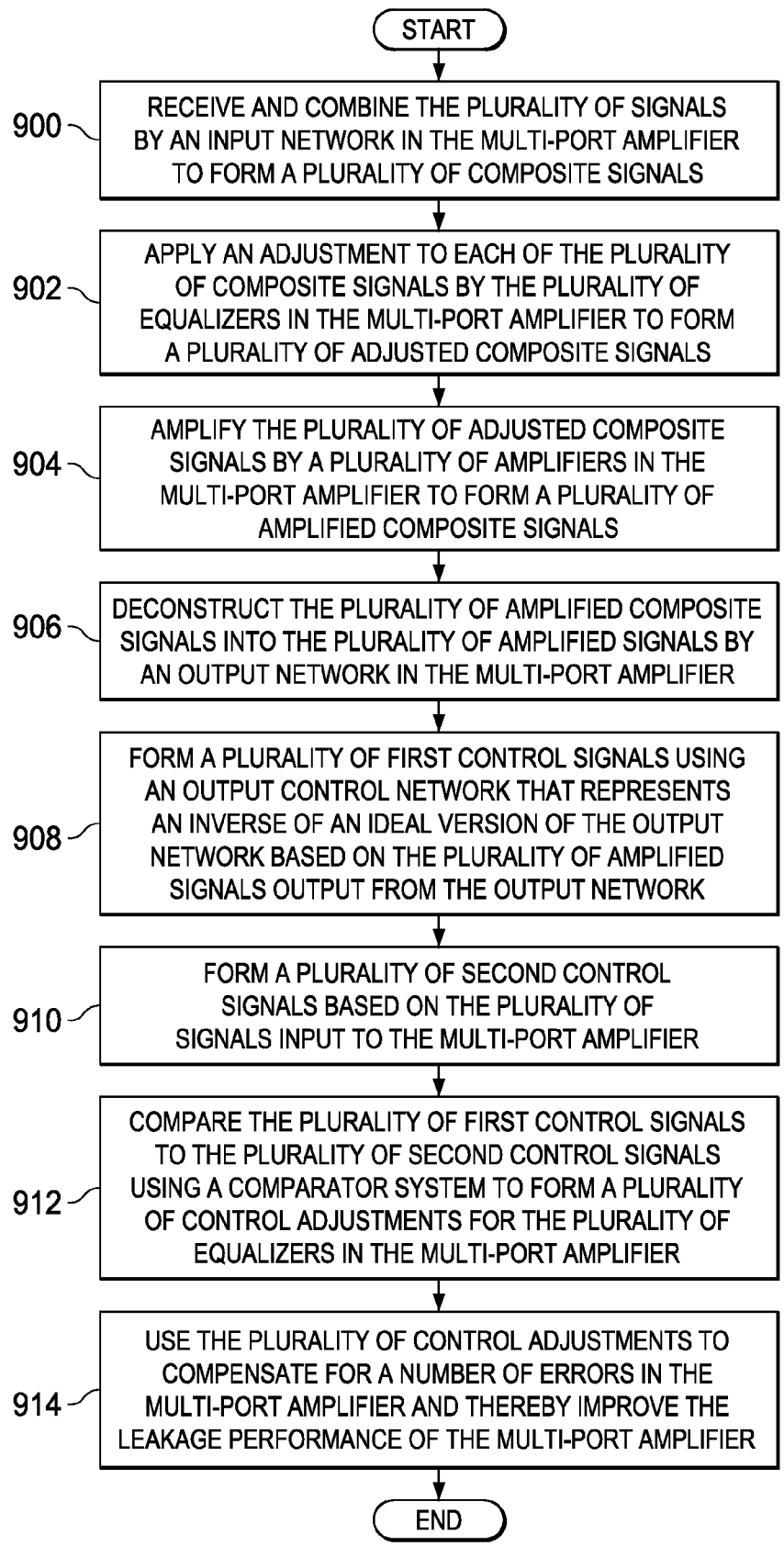
FIG. 9 is an illustration of a process for managing a multi-port amplifier in the form of a flowchart in accordance with an illustrative embodiment.

With reference now to FIG. 9, an illustration of a process for managing a multi-port amplifier is depicted in the form of a flowchart in accordance with an illustrative embodiment. The process illustrated in FIG. 9 may be implemented to manage multi-port amplifier 102 in FIG. 1.

The process may begin by receiving and combining the plurality of signals by an input network in the multi-port amplifier to form a plurality of composite signals (operation 900). An adjustment may be applied to each of the plurality of composite signals by the plurality of equalizers in the multi-port amplifier to form a plurality of adjusted composite signals (operation 902).

The plurality of adjusted composite signals may be amplified by a plurality of amplifiers in the multi-port amplifier to form a plurality of amplified composite signals (operation 904). Thereafter, the plurality of amplified composite signals may be deconstructed into the plurality of amplified signals by an output network in the multi-port amplifier (operation 906).

A plurality of first control signals may be formed using an output control network that represents an inverse of an ideal version of the output network based on the plurality of amplified signals output from the output network (operation 908). Further, a plurality of second control signals may be formed based on the plurality of signals input to the multi-port amplifier (operation 910).

Thereafter, the plurality of first control signals may be compared to the plurality of second control signals using a comparator system to form a plurality of control adjustments for the plurality of equalizers in the multi-port amplifier (operation 912). The plurality of equalizers may use the plurality of control adjustments to compensate for a number of errors in the multi-port amplifier and thereby improve the leakage performance of the multi-port amplifier (operation 914), with the process terminating thereafter.

Turning now to FIG. 10, an illustration of a data processing system in the form of a block diagram is depicted in accordance with an illustrative embodiment. Data processing system 1000 may be used to implement at least a portion of controller 104 in FIG. 1 in some illustrative examples. As depicted, data processing system 1000 includes communications framework 1002, which provides communications between processor unit 1004, storage devices 1006, communications unit 1008, input/output unit 1010, and display 1012. In some cases, communications framework 1002 may be implemented as a bus system.

Processor unit 1004 is configured to execute instructions for software to perform a number of operations. Processor unit 1004 may comprise a number of processors, a multiprocessor core, and/or some other type of processor, depending on the implementation. In some cases, processor unit 1004 may take the form of a hardware unit, such as a circuit system, an application specific integrated circuit (ASIC), a programmable logic device, or some other suitable type of hardware unit.

Instructions for the operating system, applications, and/or programs run by processor unit 1004 may be located in storage devices 1006. Storage devices 1006 may be in communication with processor unit 1004 through communications framework 1002. As used herein, a storage device, also referred to as a computer readable storage device, is any piece of hardware capable of storing information on a temporary and/or permanent basis. This information may include, but is not limited to, data, program code, and/or other information.

Memory 1014 and persistent storage 1016 are examples of storage devices 1006. Memory 1014 may take the form of, for example, a random access memory or some type of volatile or non-volatile storage device. Persistent storage 1016 may comprise any number of components or devices. For example, persistent storage 1016 may comprise a hard drive, a flash memory, a rewritable optical disk, a rewritable magnetic tape, or some combination of the above. The media used by persistent storage 1016 may or may not be removable.

Communications unit 1008 allows data processing system 1000 to communicate with other data processing systems and/or devices. Communications unit 1008 may provide communications using physical and/or wireless communications links.

Input/output unit 1010 allows input to be received from and output to be sent to other devices connected to data processing system 1000. For example, input/output unit 1010 may allow user input to be received through a keyboard, a mouse, and/or some other type of input device. As another example, input/output unit 1010 may allow output to be sent to a printer connected to data processing system 1000.

Display 1012 is configured to display information to a user. Display 1012 may comprise, for example, without limitation, a monitor, a touch screen, a laser display, a holographic display, a virtual display device, and/or some other type of display device.

In this illustrative example, the processes of the different illustrative embodiments may be performed by processor unit 1004 using computer-implemented instructions. These instructions may be referred to as program code, computer usable program code, or computer readable program code and may be read and executed by one or more processors in processor unit 1004.

In these examples, program code 1018 is located in a functional form on computer readable media 1020, which is selectively removable, and may be loaded onto or transferred to data processing system 1000 for execution by processor unit 1004. Program code 1018 and computer readable media 1020 together form computer program product 1022. In this illustrative example, computer readable media 1020 may be computer readable storage media 1024 or computer readable signal media 1026.

Computer readable storage media 1024 is a physical or tangible storage device used to store program code 1018 rather than a medium that propagates or transmits program code 1018. Computer readable storage media 1024 may be, for example, without limitation, an optical or magnetic disk or a persistent storage device that is connected to data processing system 1000.

Alternatively, program code 1018 may be transferred to data processing system 1000 using computer readable signal media 1026. Computer readable signal media 1026 may be, for example, a propagated data signal containing program code 1018. This data signal may be an electromagnetic signal, an optical signal, and/or some other type of signal that can be transmitted over physical and/or wireless communications links.

The illustration of data processing system 1000 in FIG. 10 is not meant to provide architectural limitations to the manner in which the illustrative embodiments may be implemented. The different illustrative embodiments may be implemented in a data processing system that includes components in addition to or in place of those illustrated for data processing system 1000. Further, components shown in FIG. 10 may be varied from the illustrative examples shown.

The flowcharts and block diagrams in the different depicted embodiments illustrate the architecture, functionality, and operation of some possible implementations of apparatuses and methods in an illustrative embodiment. In this regard, each block in the flowcharts or block diagrams may represent a module, a segment, a function, and/or a portion of an operation or step.

In some alternative implementations of an illustrative embodiment, the function or functions noted in the blocks may occur out of the order noted in the figures. For example, in some cases, two blocks shown in succession may be executed substantially concurrently, or the blocks may sometimes be performed in the reverse order, depending upon the functionality involved. Also, other blocks may be added in addition to the illustrated blocks in a flowchart or block diagram.

The description of the different illustrative embodiments has been presented for purposes of illustration and description, and is not intended to be exhaustive or limited to the embodiments in the form disclosed. Many modifications and variations will be apparent to those of ordinary skill in the art. Further, different illustrative embodiments may provide different features as compared to other desirable embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. An apparatus comprising:
    a multi-port amplifier configured to amplify a plurality of signals to form a plurality of amplified signals; and
    a controller configured to send a plurality of control adjustments to a plurality of equalizers in the multi-port amplifier to improve leakage performance of the multi-port amplifier;
    wherein the controller comprises a comparator system having a plurality of comparators configured to receive a plurality of first control signals from an output control network, to receive a plurality of second control signals and to compare the plurality of first control signals based on the plurality of amplified signals to the plurality of second control signals based on the plurality of signals to form the plurality of control adjustments for the plurality of equalizers.

2. The apparatus of claim 1, wherein the multi-port amplifier comprises:
    an input network configured to receive the plurality of signals and combine the plurality of signals to form a plurality of composite signals;
    the plurality of equalizers configured to apply a control adjustment to each of the plurality of composite signals to form a plurality of adjusted composite signals;
    a plurality of amplifiers configured to amplify the plurality of adjusted composite signals to form a plurality of amplified composite signals; and
    the output network configured to deconstruct the plurality of amplified composite signals into the plurality of amplified signals.

3. The apparatus of claim 2, wherein the output network comprises:
    a plurality of output ports, wherein the leakage performance of the multi-port amplifier is determined by leakage at the plurality of output ports resulting from a number of errors within the multi-port amplifier.

4. The apparatus of claim 2, wherein the controller comprises:
    the output control network configured to represent an inverse of an ideal version of the output network in the multi-port amplifier and generate the plurality of first control signals based on the plurality of amplified signals output from the output network.

5. The apparatus of claim 4, wherein the controller further comprises:
    a plurality of output couplers configured to couple the plurality of amplified signals to both a target system for the plurality of amplified signals and the output control network.

6. The apparatus of claim 4, wherein the controller further comprises:
    an input control network configured to represent an ideal version of the input network in the multi-port amplifier and generate the plurality of second control signals based on the plurality of signals received at the input network.

7. The apparatus of claim 6, wherein the controller further comprises:
    a plurality of input couplers configured to couple the plurality of signals to both the input network and the input control network.

8. The apparatus of claim 4, wherein the comparator system comprises:
    a first switching network configured to receive the plurality of first control signals from the output control network and output each of the plurality of first control signals one at a time as a selected first control signal;
    a second switching network configured to receive the plurality of second control signals from an input control network and output each of the plurality of second control signals one at a time as a selected second control signal; and
    a comparator configured to receive the selected first control signal and the selected second control signal that correspond to each other at substantially a same time and to compare the selected first control signal and the selected second control signal to form a control adjustment.

9. The apparatus of claim 8, wherein the control adjustment is sent to a corresponding equalizer in the plurality of equalizers and wherein the corresponding equalizer modifies an adjustment made to a corresponding composite signal in the plurality of composite signals based on the control adjustment.

10. The apparatus of claim 2, wherein the controller further comprises:
    a plurality of input couplers configured to couple the plurality of signals to both the input network and the plurality of comparators such that the plurality of signals are used as the plurality of second control signals.

11. The apparatus of claim 2, wherein the controller further comprises:
    a plurality of non-linear distortion elements configured to apply a distortion to each of the plurality of second control signals prior to the plurality of control signals being sent to the plurality of comparators.

12. The apparatus of claim 2, wherein the plurality of equalizers is configured to modify the adjustment made to the each of the plurality of composite signals based on the plurality of control adjustments such that the leakage performance of the multi-port amplifier is improved.

13. The apparatus of claim 1, wherein the controller further comprises:
    a logic module configured to receive and process the plurality of control adjustments to form a plurality of modified control adjustments and to send the plurality of modified control adjustments to the plurality of equalizers.

14. An amplifier system comprising:
an input network configured to receive a plurality of signals and combine the plurality of signals to form a plurality of composite signals;
a plurality of equalizers configured to apply an adjustment to each of the plurality of composite signals to form a plurality of adjusted composite signals;
a plurality of amplifiers configured to amplify the plurality of adjusted composite signals to form a plurality of amplified composite signals;
an output network configured to deconstruct the plurality of amplified composite signals into a plurality of amplified signals; and
a controller configured to send a plurality of adjustments to the plurality of equalizers to improve leakage performance of a multi-port amplifier, wherein the controller comprises:
an output control network configured to receive the plurality of amplified signals and form a plurality of first control signals using the plurality of amplified signals; and
a comparator system having a plurality of comparators configured to receive a plurality of first control signals from an output control network, to receive a plurality of second control signals and to compare the plurality of first control signals based on the plurality of amplified signals to the plurality of second control signals based on the plurality of signals to form the plurality of control adjustments for the plurality of equalizers.

15. A method for managing a multi-port amplifier, the method comprising:
receiving a plurality of signals;
amplifying the plurality of signals using the multi-port amplifier to form a plurality of amplified signals;
comparing a plurality of first control signals based on the plurality of amplified signals to a plurality of second control signals based on the plurality of signals using a comparator system having a plurality of comparators to form a comparison; and
identifying a plurality of control adjustments based on the comparison to be sent to a plurality of equalizers in the multi-port amplifier to improve leakage performance of the multi-port amplifier.

16. The method of claim 15, wherein amplifying the plurality of signals using the multi-port amplifier to form the plurality of amplified signals comprises:
receiving and combining the plurality of signals by an input network in the multi-port amplifier to form a plurality of composite signals;
applying an adjustment to each of the plurality of composite signals by the plurality of equalizers in the multi-port amplifier to form a plurality of adjusted composite signals;
amplifying the plurality of adjusted composite signals by a plurality of amplifiers in the multi-port amplifier to form a plurality of amplified composite signals; and
deconstructing the plurality of amplified composite signals into the plurality of amplified signals by an output network in the multi-port amplifier.

17. The method of claim 16, wherein identifying the plurality of control adjustments to be sent to the plurality of equalizers comprises:
generating the plurality of first control signals using an output control network that represents an inverse of an ideal version of the output network based on the plurality of amplified signals output from the output network; and
sending the plurality of signals to the comparator system as the plurality of second control signals.

18. The method of claim 17, wherein identifying the plurality of control adjustments to be sent to the plurality of equalizers further comprises:
receiving the plurality of signals at an input control network that represents an ideal version of the input network in the multi-port amplifier; and
generating the plurality of second control signals based on the plurality of signals.

19. An apparatus comprising:
a multi-port amplifier configured to amplify a plurality of signals to form a plurality of amplified signals, wherein the multi-port amplifier comprises: an input network configured to receive the plurality of signals and combine the plurality of signals to form a plurality of composite signals; a plurality of equalizers configured to apply an adjustment to each of the plurality of composite signals to form a plurality of adjusted composite signals; a plurality of amplifiers configured to amplify the plurality of adjusted composite signals to form a plurality of amplified composite signals; and an output network configured to deconstruct the plurality of amplified composite signals into the plurality of amplified signals; and
a controller configured to send a plurality of control adjustments to a plurality of equalizers in the multi-port amplifier to improve leakage performance of the multi-port amplifier, wherein the controller comprises: an output control network configured to substantially represent an inverse of an ideal version of the output network in the multi-port amplifier and generate a plurality of first control signals based on the plurality of amplified signals output from the output network; an input control network configured to represent an ideal version of the input network in the multi-port amplifier and generate a plurality of second control signals based on the plurality of signals received at the input network; and a comparator system configured to compare the plurality of first control signals to a plurality of second control signals to form the plurality of control adjustments for the plurality of equalizers.

20. A method for managing a multi-port amplifier, the method comprising:
receiving a plurality of signals by an input network of the multi-port amplifier;
combining the plurality of signals by the input network to form a plurality of composite signals;
applying an adjustment to each of the plurality of composite signals by a plurality of equalizers to form a plurality of adjusted composite signals;
amplifying the plurality of adjusted composite signals by a plurality of amplifiers to form a plurality of amplified composite signals;
deconstructing the plurality of amplified composite signals by an output network into a plurality of amplified signals;
generating a plurality of first control signals based on the plurality of amplified signals output from the output network, wherein the plurality of first control signals is generated by an output control network configured to substantially represent an inverse of an ideal version of the output network in the multi-port amplifier;
generating a plurality of second control signals based on the plurality of signals received at the input network, wherein the plurality of first control signals is generated by an input control network configured to represent an ideal version of the input network in the multi-port amplifier; and comparing the plurality of first control signals to the plurality of second control signals to form the plurality of control adjustments for the plurality of equalizers.

* * * * *